United States Patent
Mugibayashi et al.

(10) Patent No.: US 6,242,318 B1
(45) Date of Patent: Jun. 5, 2001

(54) ALIGNMENT METHOD AND SEMICONDUCTOR DEVICE

(75) Inventors: Toshiaki Mugibayashi; Yoko Miyazaki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/122,793

(22) Filed: Jul. 27, 1998

(30) Foreign Application Priority Data

Feb. 13, 1998 (JP) .................................................. 10-031469

(51) Int. Cl.$^7$ ........................... H01L 21/76; G01B 11/00; G01N 21/86
(52) U.S. Cl. ........................... 438/401; 356/401; 356/25; 250/548
(58) Field of Search ................................. 438/7, 401, 14; 356/401, 101; 250/548; 324/158; 318/625; 257/797

(56) References Cited

U.S. PATENT DOCUMENTS

| | | | |
|---|---|---|---|
| 4,475,122 | * 10/1984 | Green | 358/101 |
| 4,600,309 | * 7/1986 | Fay | 356/401 |
| 4,780,617 | * 10/1988 | Umatate et al. | 250/548 |
| 4,853,549 | * 8/1989 | Yanagisawa et al. | 250/491.1 |
| 4,929,893 | * 5/1990 | Sato et al. | 324/158 |
| 5,044,750 | 9/1991 | Shamble . | |
| 5,452,090 | * 9/1995 | Progler et al. | 356/401 |
| 5,615,006 | * 3/1997 | Hirukawa et al. | 356/124 |
| 5,773,951 | * 6/1998 | Markowski et al. | 318/625 |
| 5,923,990 | * 7/1999 | Miura | 438/401 |
| 5,985,680 | * 11/1999 | Singhal et al. | 438/7 |

* cited by examiner

*Primary Examiner*—Long Pham
*Assistant Examiner*—William David Coleman
(74) *Attorney, Agent, or Firm*—Oblon, Spivak, McClelland, Maier & Neustadt, P.C.

(57) ABSTRACT

The alignment method allows a constant decision of an alignment point even with an indistinct outline of an alignment mark. An operator moves a chip (2) so that the whole or parts of an alignment mark (1) (including at least angles D0A0B0 and A0B0C0) is included within a lens view field (4), and then decides an alignment point (AP0). More specifically, the operator reads angles which are specified to obtain bisectors, from a defect inspection apparatus; obtains respective bisectors of the angles; and decides the intersection thereof to be the alignment point (AP0). Then, a stage drive required to superimpose the alignment point (AP0) on the center (O) is calculated on the basis of the shift amount between the position of the alignment point (AP0) and the center (O) of a target scope (5) displayed at the lens view field (4). The chip (2) is then moved by the stage drive.

12 Claims, 16 Drawing Sheets

ALIGNMENT METHOD AND SEMICONDUCTOR DEVICE

BACKGROUND OF THE INVENTION

1. Field of the Invention

The present invention relates to an alignment method for disposing an object to be inspected in position on a defect inspection apparatus in defect inspection of a semiconductor device such as a DRAM or a microcomputer, or a display device such as a TFT or a PDP. The invention also relates to a semiconductor device having a predetermined alignment mark.

2. Background of the Invention

The defect inspection is carried out halfway through a manufacturing process of the semiconductor device or the display device. The defect inspection apparatus requires accurate positioning of a testing chip that may be any part of a testing object, such as a semiconductor device, on a stage. Thus, an alignment mark for alignment is attached to the chip.

FIG. 28 is a plan view showing the component of a chip 200 on the testing object. A rectangular alignment mark 100 is attached to the chip. In order to ensure exact alignment motion on the chip 200, an operator specifies a predetermined alignment point on the alignment mark 100 and teaches the coordinates of the alignment point and alignment mark image to the defect inspection apparatus. FIG. 29 is a view of a teaching screen 300. The alignment mark 100 is displayed thereon. For example, a point of intersection of sides 10a and 10b of the alignment mark 100 is specified as an alignment point AP100, and the image of the alignment mark 100 and the position of the specified alignment point AP100 are taught to and stored in the defect inspection apparatus.

To locate the testing chip 200 in position in the defect inspection apparatus, the defect inspection apparatus searches the chip 200 located on the stage of the apparatus for the same figure as the taught alignment mark 100, using image signal processing technique. Then, the alignment point AP100 is decided on the basis of the discovered figure.

However, automatical searching of the alignment mark by the defect inspection apparatus is getting increasingly difficult due to, for example, an introduction of a CMP (Chemical Mechanical Polishing) method to a planalization technique for a wafer surface. When the automatical searching by the defect inspection apparatus fails, an operator searches for the alignment mark manually and locates the stage in position. FIG. 30 is an illustration of the testing chip for the manual alignment operation. The operator search the chip 200 for the alignment mark 100 within a lens view field 400 of a lens of the defect inspection apparatus, while moving the chip 200 by driving the stage of the defect inspection apparatus. After discovering the alignment mark 100, the operator decides the alignment point AP100 from the discovered alignment mark 100, following the procedure for designating the alignment point AP100. Then, the testing object which includes the chip 200 is moved by driving the stage of the defect inspection apparatus so that the specified alignment point AP100 is superimposed on a center O of a target scope 50 displayed at the lens view field 400. The target scope center O is the landmark of the apparatus detection point (coordination).

FIG. 31 shows that the alignment mark 100 has the indistinct threefold outline. This kind of phenomenon may occur in both cases where the alignment mark 100 is displayed on the teaching screen 300 so that the alignment point etc. is taught to the defect inspection apparatus, and where the alignment mark 100 is displayed at the lens view field 400 in inspection. Thus, aside from the case where one and the same operator conducts an inspection and teach the alignment point location to the defect inspection apparatus, when one operator conducts an inspection and another operator do the teaching, they may decide that a wrong position be the alignment point because of their differences of recognition of the figure outline. This prevents accurate alignment. Such a problem will arise, for example, when one operator teaches the alignment point AP100 to the defect inspection apparatus while another operator decides an alignment point AP101 in inspection. Further, when the point previously taught at the other process is taught as the alignment point, the same problem will arise because of differences of layers to be formed.

FIGS. 32 to 35 sequentially show the alignment method improving accuracy in alignment. With a coarse alignment mark 100 and a fine alignment mark 101 formed on a chip 201, the testing chip is aligned on the basis of the coarse alignment mark 100 in the same way as described above (see FIG. 33). The chip is then aligned on the basis of the fine alignment mark 101 after the lens set at the defect inspection apparatus is changed into a higher-powered one (see FIGS. 34 and 35). However, since the coarse alignment mark 100 and the fine alignment mark 101 are separately formed, an area necessary to form the alignment mark is increased, and accordingly, an element forming area of the chip 201 is reduced.

SUMMARY OF THE INVENTION

A first aspect of the present invention is directed to an alignment method comprising steps of: searching for an alignment mark of a testing object; recognizing first and second angles which are previously specified on the basis of the outline of a figure forming the alignment mark, from the discovered alignment mark; and deciding an intersection of a first bisector of the first angle and a second bisector of the second angle to be an alignment point.

Preferably, according to a second aspect of the present invention, in the alignment method according to the first aspect, each of the first and second angles is formed by specifying two line segments out of a plurality of line segments and crossing said line segments. The plurality of line segments form the outline.

Preferably, according to a third aspect of the present invention, in the alignment method according to the first aspect, a search for the alignment mark is conducted within a lens view field where a target scope having first and second axes is displayed. The first and second axes are arranged in parallel with the first and second bisectors, respectively.

Preferably, according to a fourth aspect of the present invention, in the alignment method according to the third aspect, the figure is a rhombus in shape, and adjacent two angles out of four angles of the rhombus are specified as the first and second angles.

Preferably, according to a fifth aspect of the present invention, in the alignment method according to the fourth aspect, obtaining an intersection of the first and second bisectors is equivalent to obtaining an intersection of two diagonals of the rhombus.

Preferably, according to a sixth aspect of the present invention, in the alignment method according to the third aspect, the alignment mark is a pattern formed on the testing object.

Preferably, according to a seventh aspect of the present invention, in the alignment method according to the sixth aspect, the pattern is a rectangle in shape, and two adjacent angles out of four angles of the rectangle are specified as the first and second angles.

Preferably, according to an eighth aspect of the present invention, in the alignment method according to the first aspect, the alignment mark includes a coarse alignment mark and a fine alignment mark. The alignment method comprises steps of: aligning the testing object on the basis of the coarse alignment mark, using a low-powered lens; and aligning the testing object on the basis of the fine alignment mark after changing the first low-powered lens into a high-powered lens. The fine alignment mark is formed in the coarse alignment mark.

Preferably, according to a ninth aspect of the present invention, in the alignment method according to the first aspect, the alignment mark consists of a plurality of figures.

Preferably, according to a tenth aspect of the present invention, in the alignment method according to the first aspect, the alignment mark is formed in a dicing line.

An eleventh aspect of the present invention is directed to a semiconductor device comprising: an alignment mark wherein an intersection of respective bisectors of first and second angles which is specified on the basis of the outline of a figure forming the alignment mark, is decided to be an alignment point.

Preferably, according to a twelfth aspect of the present invention, in the semiconductor device according to the eleventh aspect, the figure is a rhombus in shape, and adjacent two angles out of four angles of the rhombus are specified as the first and second angles.

According to the first aspect of the present invention, the intersection of the first and second bisectors is decided to be the alignment point, even if the outline of the discovered alignment mark is indistinct. This allows the operators to decide a constant alignment point irrespective of their differences of outline recognition.

Further, according to the second aspect of the present invention, even if the outline of the alignment mark is indistinct and the angles of the figure forming the alignment mark are round in observation, two angles can be appropriately specified to obtain bisectors.

Further, according to the third aspect of the present invention, the first and second axes of the target scope are arranged in parallel with the first and second bisectors, respectively. Thus, the intersection of the first and second axes of the target scope can be decided to be the alignment point. This eliminates the necessity of obtaining the bisectors of the first and second angles, thereby facilitating the decision of the alignment point.

Further, according to the fourth aspect of the present invention, since the figure forming the alignment mark is a rhombus in shape, the first and second bisectors are orthogonal to each other. Thus, the alignment point can be decided by using the conventional crisscross target scope.

Further, according to the fifth aspect of the present invention, the intersection of the diagonals of the rhombus is decided to be the alignment point. This facilitates the decision of the alignment point, in comparison with the case where the intersection of the respective bisectors of the specified first and second angles is decided to be the alignment point.

Further, according to the sixth aspect of the present invention, since the pattern formed on the testing object is used as the alignment mark, there is no necessity to provide an area to form the alignment mark in the testing object.

Further, according to the seventh aspect of the present invention, the rectangular patterns that are generally formed in large numbers in the testing object are used as the alignment mark. Besides, the first and second bisectors are orthogonal to each other. Thus, the alignment point can be easily decided by using the conventional crisscross target scope that is tilted 45 degrees from the vertical axis in the lens view field.

Further, according to the eight aspect of the present invention, the fine alignment mark is formed in the coarse alignment mark. This reduces the area necessary to form the alignment mark, as compared with the conventional case where the coarse alignment mark and the fine alignment mark are separately formed in the testing object.

Further, according to the ninth aspect of the present invention, since the area of the figure can be reduced, the risk that the alignment mark may come off during the process can be reduced accordingly.

Further, according to the tenth aspect of the present invention, since the alignment mark is provided in the dicing line, there is no necessity to provide a region to form the alignment mark in the testing object. This eliminates the necessity of reducing the area of the element-forming region in the testing object.

Further, according to the eleventh aspect of the present invention, the intersection of the respective bisectors of the first and second angles is decided to be the alignment point, even if the outline of the alignment mark is indistinct. This allows the operators to decide a constant alignment point, irrespective of their differences of outline recognition.

Further, according to the twelfth aspect of the present invention, since the figure forming the alignment mark is a rhombus in shape, the first and second bisectors are orthogonal to each other. Thus, the alignment point can be decided by using the conventional crisscross target scope.

An object of the present invention is to achieve the alignment method which allows operators to decide a constant alignment point irrespective of their differences of outline recognition, even if the alignment mark displayed on the teaching screen or at the lens view field, has the indistinct outline. The method requires only a small area to form the alignment mark, while achieving accurate alignment, using the coarse alignment mark and the fine alignment mark.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
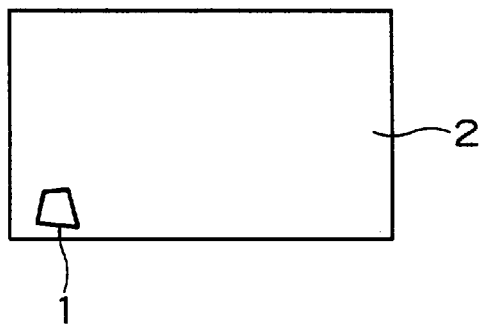
FIG. 1 is a plan view showing a structure of a chip.
Figure 2:
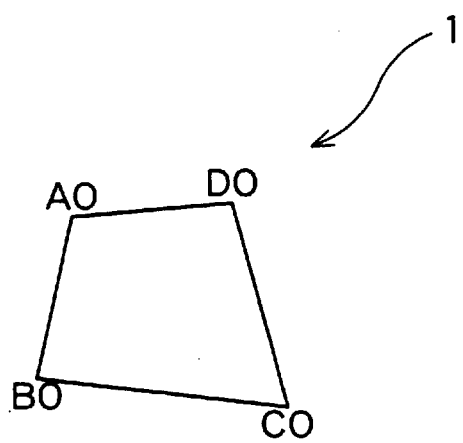
FIG. 2 is a plan view showing an enlarged alignment mark 1.

FIG. 1 is a plan view showing a structure of a chip. An alignment mark 1 is formed on a chip 2. FIG. 2 is a plan view showing the enlarged alignment mark 1. The alignment mark 1 is a trapezium in shape, having four vertices A0, B0, C0, and D0.

Figure 3:
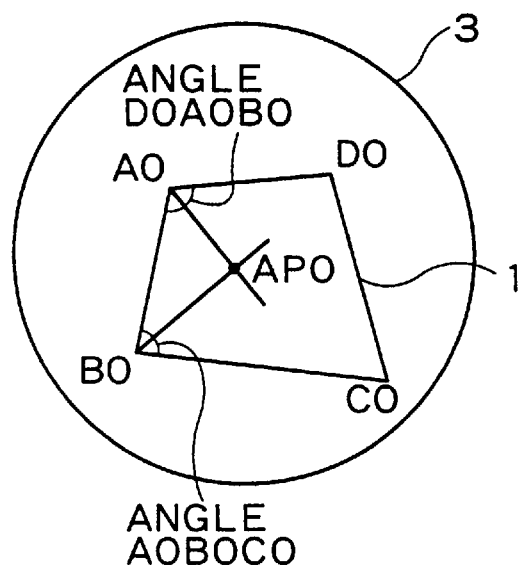
FIG. 3 is an illustration of a method for setting an alignment point.

FIG. 3 is an illustration of a method for setting an alignment point. An operator displays the alignment mark 1 on a teaching screen 3, and specifies any two angles of a figure forming the alignment mark 1. In this case, angles D0A0B0 and A0B0C0 are specified. Then, the operator obtains respective bisectors of the specified two angles; sets an intersection of the bisectors as an alignment point AP0; and teaches to a defect inspection apparatus, the form of the alignment mark 1, the position of the alignment point AP0, and the two angles (D0A0B0 and A0B0C0) specified to obtain the respective bisectors.

To locate the chip 2 in position on a stage of the defect inspection apparatus, the defect inspection apparatus automatically searches the chip 2 on the stage for the same figure as the alignment mark 1, using image signal processing technique. Then, on the basis of the discovered figure, the alignment point AP0 is decided. When the defect inspection apparatus fails to recognize the alignment mark 1 in automatic search, the operator conducts a manual search for the alignment mark 1.

Figure 4:
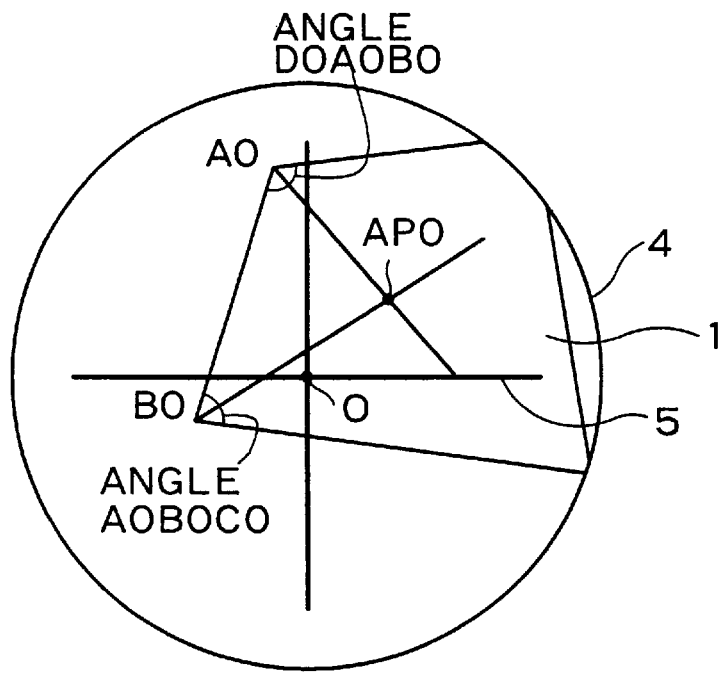
FIG. 4 is an illustration of a manual search for the alignment mark 1 by an operator.
Figure 5:
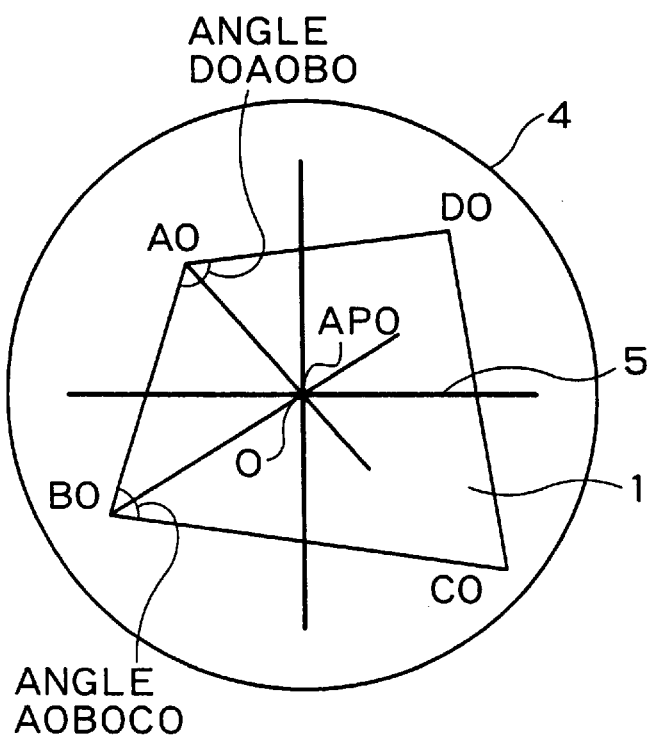
FIG. 5 shows a lens view field 4 after a chip 2 is moved.

FIG. 4 is an illustration of the manual search for the alignment mark 1 by the operator. The operator searches the chip 2 for the alignment mark 1 while moving the chip 2 by driving the stage of the defect inspection apparatus. After discovering the alignment mark 1, the operator moves the chip 2 so that the whole or parts of the alignment mark 1 (including at least the angles D0A0B0 and A0B0C0) is included within a lens view field 4, and then decides the alignment point AP0. More specifically, the operator reads the angles specified to obtain bisectors from the defect inspection apparatus; obtains the respective bisectors of the specified angles; and decides the alignment point AP0 by referring to the intersection of the bisectors. Then, on the basis of the shift amount between the position of the specified alignment point AP0 and the center O of a target scope 5 displayed at the lens view field 4, a stage drive required to superimpose the alignment point AP0 on the center O is calculated. The chip 2 is then moved by the stage drive. FIG. 5 shows the lens view field 4 after the chip 2 is moved. In this manner, the wafer with the chip 2 formed thereon is accurately aligned in position on the stage of the defect inspection apparatus.

Figure 6:
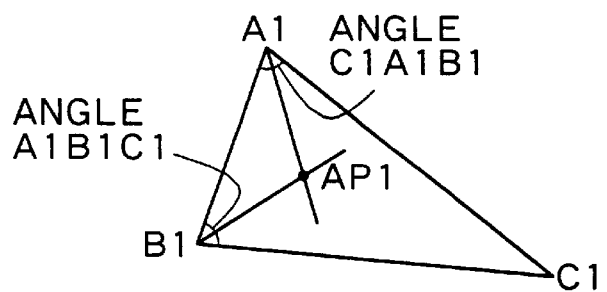
FIG. 6 shows a triangular alignment mark.
Figure 7:
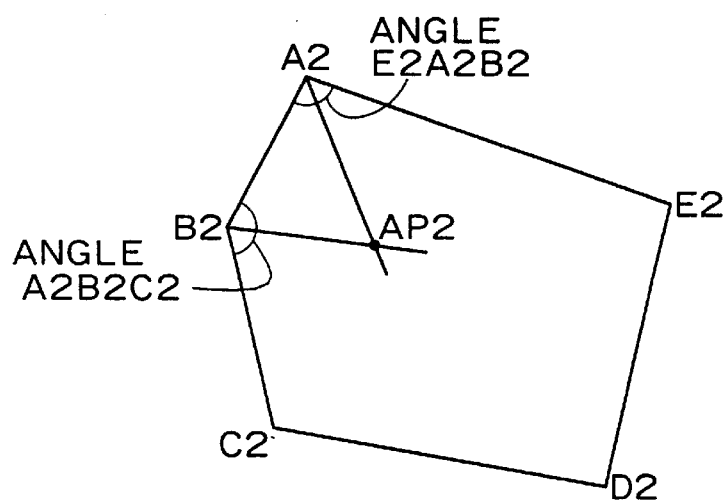
FIG. 7 shows a pentagonal alignment mark.
Figure 8:
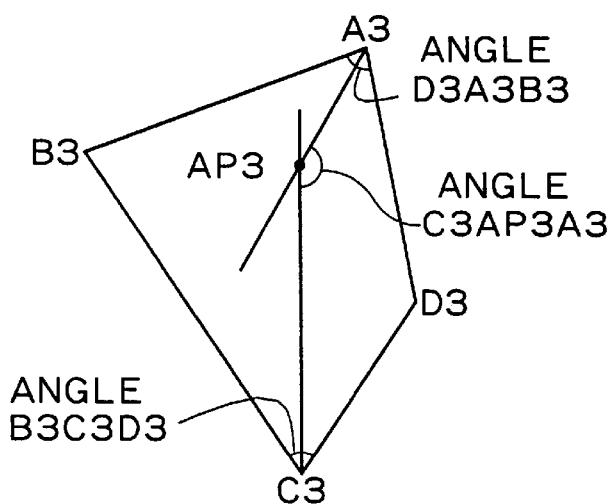
FIG. 8 shows an alignment mark with opposed two angles specified to obtain bisectors.

While being a trapezium in the previous description, the image of the alignment mark 1 may be a triangle as shown in FIG. 6 (in this case, the intersection of respective bisectors of angles C1A1B1 and A1B1C1 is specified as an alignment point AP1), or a pentagon as shown in FIG. 7 (in this case, the intersection of respective bisectors of angles E2A2B2 and A2B2C2 is specified as an alignment point AP2). Further, the two angles specified to obtain bisectors need not be adjacent to each other, but may be opposed to each other as shown in FIG. 8 (angles D3A3B3 and B3C3D3). In this case, however, the bisectors of the specified two angles cannot agree with nor run in parallel with each other. Even if this condition were satisfied, when the two bisectors run almost parallel to each other, it would be difficult to specify the intersection thereof. Thus, in terms of the specification of the intersection, an angle C3AP3A3 is ideally 90 degrees or preferably between 60 and 120 degrees. As is evident from the previous description, the alignment mark 1 may be any figure as long as having two bisectors that do not agree with nor run in parallel with each other.

Figure 9:
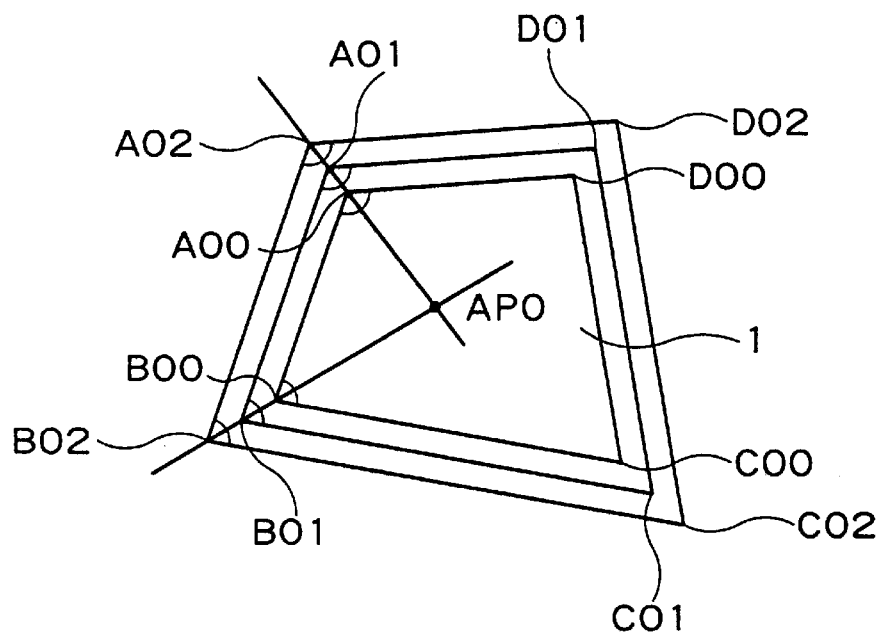
FIG. 9 is an illustration of the effect of an alignment method according to a first preferred embodiment of the present invention.

Therefore, even if the alignment mark displayed on the teaching screen or at the lens view field has the indistinct outline and different operators do the setting of the alignment mark and the inspection, the alignment method according to the first preferred embodiment of the present invention allows the operators to decide a constant alignment point irrespective of their differences of outline recognition. FIG. 9 concretely illustrates the effect of the alignment method according to the first preferred embodiment of the present invention. Assuming that an operator to set the alignment point specifies two angles D00A00B00 and A00B00C00 to obtain bisectors and teaches these angles to the defect inspection apparatus, and that another operator to actually conduct an inspection recognizes two angles D01A01B01 and A01B01C01 as vertices on the outline of the alignment mark 1. Even in this case, the alignment point decided by referring to respective bisectors of the angles D01A01B01 and A01B01C01 is AP0, which is the alignment point taught to the defect inspection apparatus. Therefore, the differences of recognition of the alignment mark outline between the operator does not lead to misjudgment of the alignment point AP0.

While the foregoing description gives only the alignment of the testing chip on the stage of the defect inspection apparatus, the method of the present invention is of course applicable to the case where a testing object in a processing device is aligned in a general semiconductor manufacturing process and so on. In this case, the same effect will be obtained.

2. Second Preferred Embodiment

Figure 10:
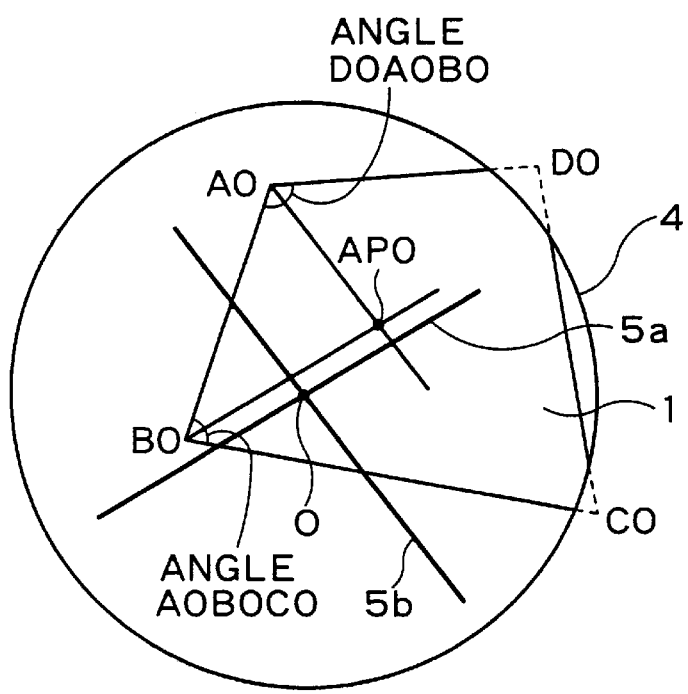
FIG. 10 is an illustration of an alignment method according to a second preferred embodiment of the present invention.

FIG. 10 is an illustration of the alignment method according to a second preferred embodiment of the present invention. The following description is given on the assumption that angles D0A0B0 and A0B0C0 of the alignment mark 1 are specified to obtain bisectors. In the second preferred embodiment, first and second axes 5a and 5b of a target scope displayed at the lens view field 4 are disposed in parallel with bisectors of the angles D0A0B0 and A0B0C0, respectively.

Figure 11:
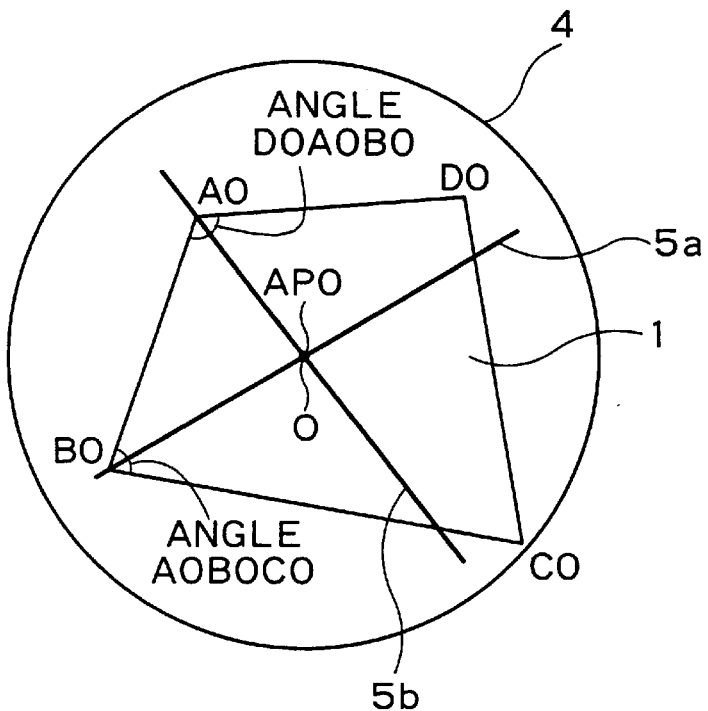
FIG. 11 is an illustration of the effect of an alignment method according to the second preferred embodiment of the present invention.

FIG. 11 is an illustration of the effect of the alignment method according to the second preferred embodiment of the present invention. In the alignment method shown in FIG. 11, the chip 2 is moved so that the angles D0A0B0 and A0B0C0 are adjusted to the axes 5b and 5a, respectively. This eliminates the necessity of obtaining the bisectors of the specified angles in defect inspection, thereby facilitating the alignment of the chip.

3. Third Preferred Embodiment

Figure 12:
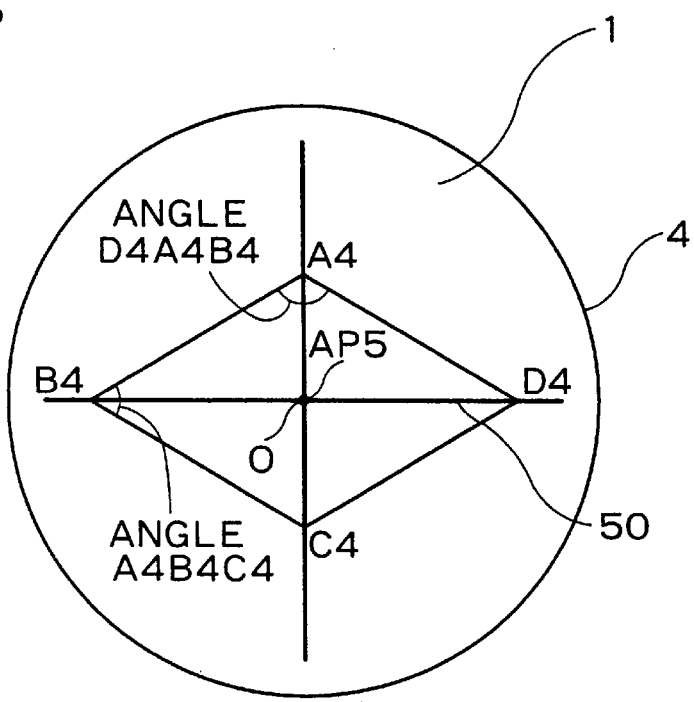
FIG. 12 is an illustration of an alignment method according to a third preferred embodiment of the present invention.

FIG. 12 is an illustration of the alignment method according to a third preferred embodiment of the present invention. In the third preferred embodiment, as shown in FIG. 12, the alignment mark 1 is a rhombus in shape, and adjacent two angles (for example, D4A4B4 and A4B4C4) out of four angles of the rhombus are specified to obtain bisectors. For alignment of the chip, an operator who actually conducts a defect inspection moves the chip 2 within the lens view field 4 so that the angles D4A4B4 and A4B4C4 are adjusted to axes of a target scope 50, respectively.

In the alignment method according to the third preferred embodiment of the present invention, since the bisectors of the angles are orthogonal to each other, the alignment point can be decided by using the conventional crisscross target scope. Further, the rhombic alignment mark achieves the following effects. In order to decide the alignment point of a trapezium-shaped alignment mark, respective bisectors of two specified angles need to be obtained. Here, obtaining the intersection of the bisectors of the two specified angles of the trapezium-shaped alignment mark is equivalent to obtaining the intersection of diagonals of the rhombic alignment mark. Thus, in the case of FIG. 12, an alignment mark AP5 can be easily decided by obtaining the intersection of a first diagonal connecting vertices B4 and D4, and a second diagonal connecting vertices A4 and C4.

4. Fourth Preferred Embodiment

In the aforementioned first to third preferred embodiments, the angles are specified to obtain bisectors on the basis of the vertices of the figure forming the alignment mark 1. On the other hand, in this fourth preferred embodiment, those angles are specified on the basis of line segments forming the figure.

Figure 13:
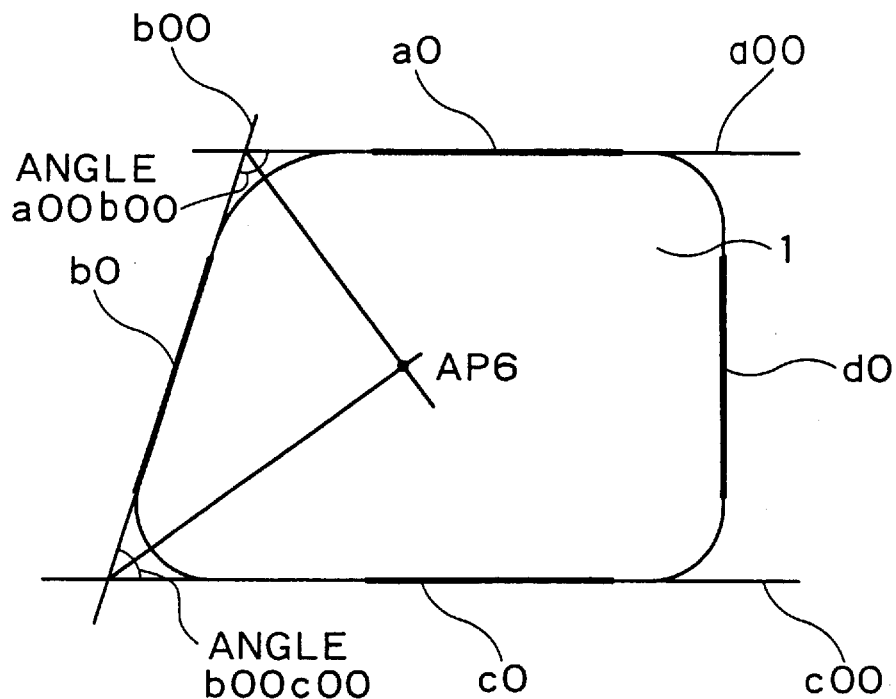
FIG. 13 is an illustration of an alignment method according to a fourth preferred embodiment of the present invention.
Figure 14:
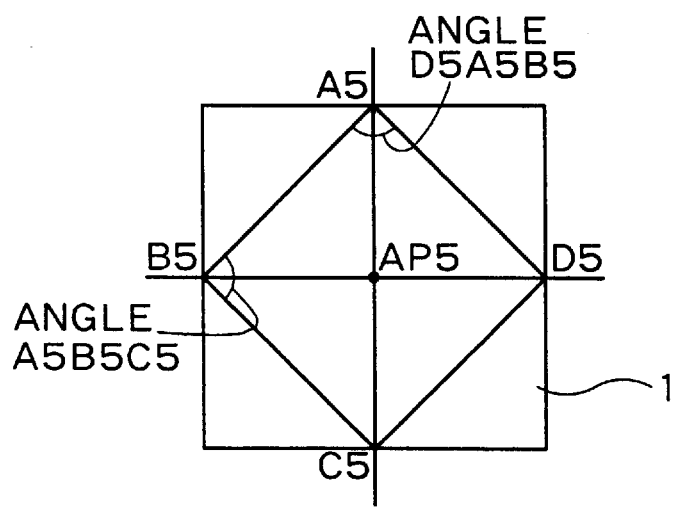
FIGS. 14 to 17 illustrate figures forming the alignment mark 1.
Figure 15:
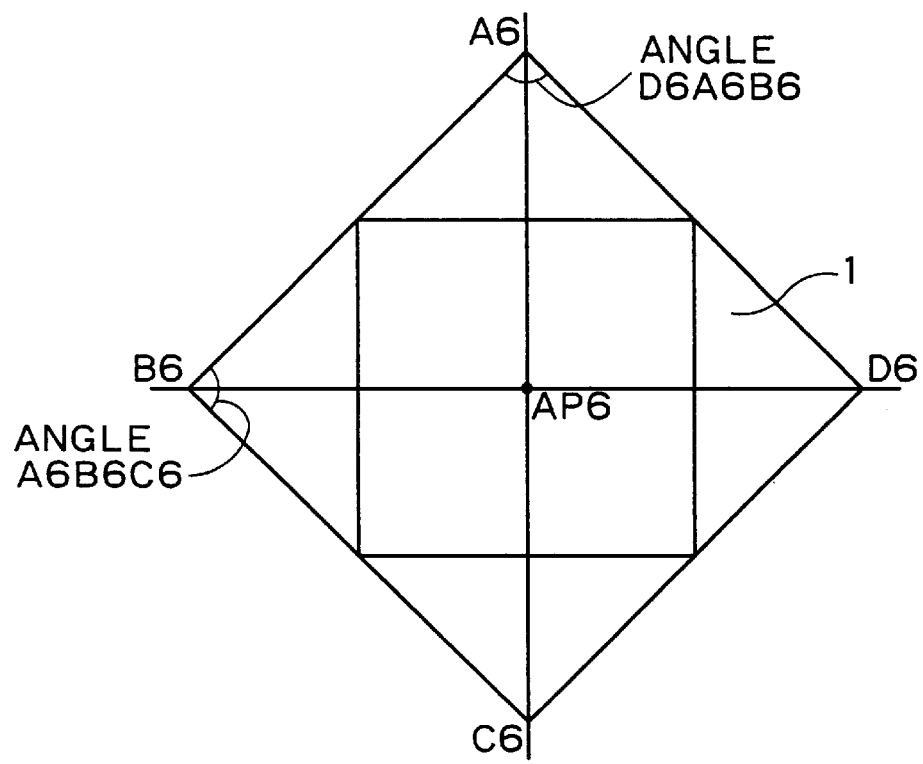
Figure 16:
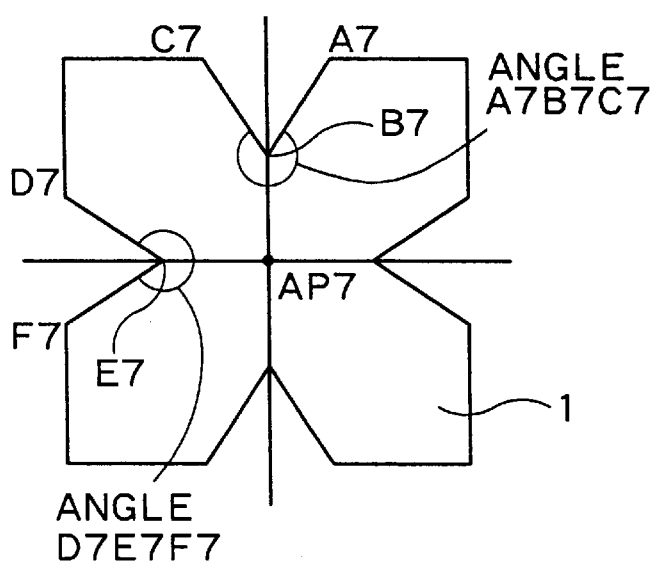
Figure 17:
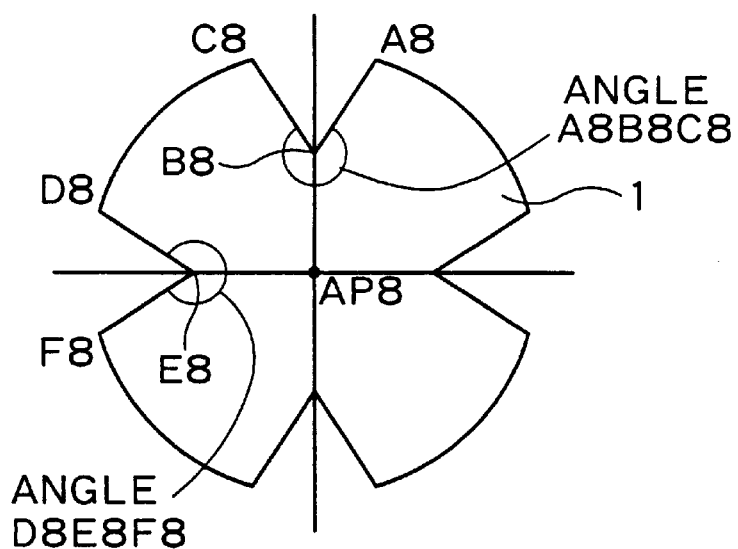

FIG. 13 is an illustration of the alignment method according to the fourth preferred embodiment of the present invention. The alignment mark 1 has four line segments a0 to d0. First, an operator to teach the alignment point to the defect inspection apparatus displays the alignment mark 1 on the teaching screen, and specifies two line segments out of the four line segments a0 to d0 which form the alignment mark 1. In this case, the line segments a0 and b0 are specified. The line segments a0 and b0 are extended to be straight lines a00 and b00, respectively, and an angle a00b00 formed by the intersection of the straight lines a00 and b00 is specified as a first angle. Next, the operator specifies any two line segments, at least one of that should be different from the line segments a0 and b0 previously specified. In this case, the line segments b0 and c0 are specified. The line segments b0 and c0 are extended to be straight lines b00 and c00, respectively, and an angle b00c00 formed by the intersection of the straight lines b00 and c00 is specified as a second angle. Then, the intersection of respective bisectors of the first and second angles is set as an alignment point AP6. The operator then teaches to the defect inspection apparatus, the image of the alignment mark 1, the position of the set alignment point AP6, and the two pairs of the line segments (a0 and b0, b0 and c0) specified to obtain the bisectors.

When the automatic search for the alignment mark 1 by the defect inspection apparatus fails and shifts to the manual search by the operator, the operator reads the two pairs of the line segments specified to obtain bisectors, from the defect inspection apparatus. Then, the operator extends the two pairs of line segments a0, b0 and b0, c0 to be straight lines a00, b00, and c00, respectively, and obtains a bisector of an angle formed by the intersection of the straight lines a00 and b00 and a bisector of an angle formed by the intersection of the straight lines b00 and c00. The alignment point AP6 is then decided by referring to the intersection of the bisectors.

In this manner, the alignment method according to the fourth preferred embodiment of the present invention makes it possible to appropriately specify the angles to obtain bisectors, even if the outline of the alignment mark is indistinct and thus the vertices of the figure forming the alignment mark are uncertain.

5. Fifth Preferred Embodiment

While formed only of one figure in the aforementioned first to fourth preferred embodiments, the alignment mark 1 may be formed of a plurality of figures as long as having two bisectors that do not agree with nor run in parallel with each other. Further, the specified angles viewed from the alignment point may be either acute or obtuse. Thus, the figures as shown in FIGS. 14 to 17 may be used as the alignment mark 1.

As described above, the alignment method according to the fifth preferred embodiment of the present invention increases variance of applicable figures forming the alignment mark. Especially, the application of the figures shown in FIGS. 14 and 15 reduces the areas of the figures, thereby reducing the risk that the alignment mark may come off during the process.

6. Sixth Preferred Embodiment

Figure 18:
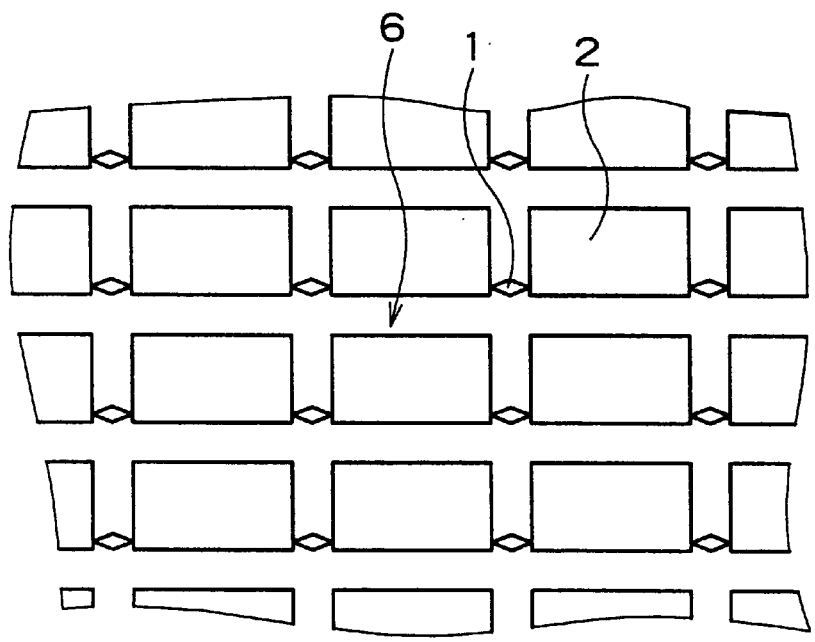
FIG. 18 is a plan view showing a partially enlarged structure of a wafer with a plurality of chips 2 formed thereon.

FIG. 18 is a plan view showing a partially enlarged structure of a wafer with a plurality of chips 2 formed thereon. Dicing lines 6 are provided between the adjacent chips 2, respectively, to isolate each chip. In this sixth preferred embodiment, the alignment marks 1 are formed in the dicing lines 6. Although rhombus in shape in FIG. 18, the alignment mark may be any figure as long as having two bisectors that do not agree with nor run in parallel with each other figure, as described above.

In the sixth preferred embodiment of the present invention, since the alignment marks are formed on the dicing lines, there is no necessity of providing the area to form the alignment mark in the chip. This secures a sufficient element forming area in the chip.

7. Seventh Preferred Embodiment

Figure 19:
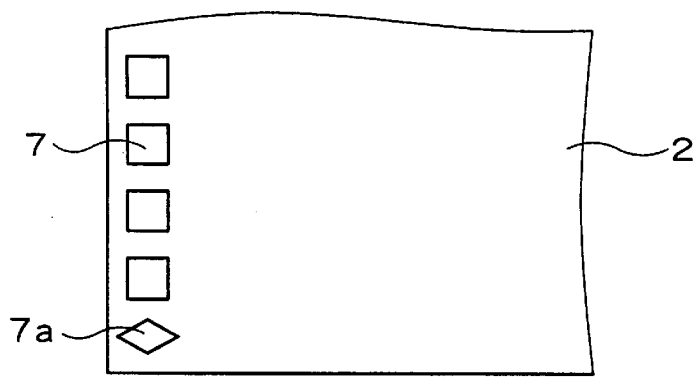
FIGS. 19 and 20 are plan views showing partially enlarged structures of the chip 2.

FIG. 19 is a plan view showing a partially enlarged structure of the chip 2. On the chip 2 formed are a plurality of bonding pads 7, one of which is for example a rhombic bonding pad 7a which functions as an alignment mark. If only the figure forming the alignment mark is recognizable by the image signal processing technique, no electrical characteristic of the alignment mark is required.

Thus, the alignment mark may be a test pattern to be a wire or capacitor or may be a pattern which functions as a product such as a bonding pad. Those patterns are designed to satisfy the condition described in the first preferred embodiment.

Therefore, the alignment method according to the seventh preferred embodiment of the present invention eliminates the necessity of providing a new area to form the alignment mark, thereby securing a sufficient element-forming area in the chip and increasing variance of product layout.

8. Eighth Preferred Embodiment

Figure 20:
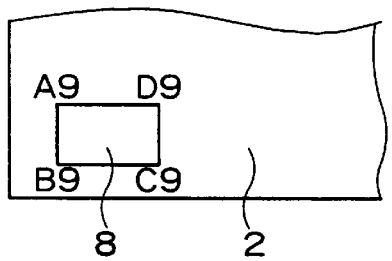

FIG. 20 is a plan view showing a partially enlarged structure of the chip 2. In this eighth preferred embodiment used as the alignment mark is not only a predetermined pattern in the chip 2 as described in the seventh preferred embodiment, but also a rectangular pattern 7 having four vertices A9, B9, C9 and D9.

Figure 21:
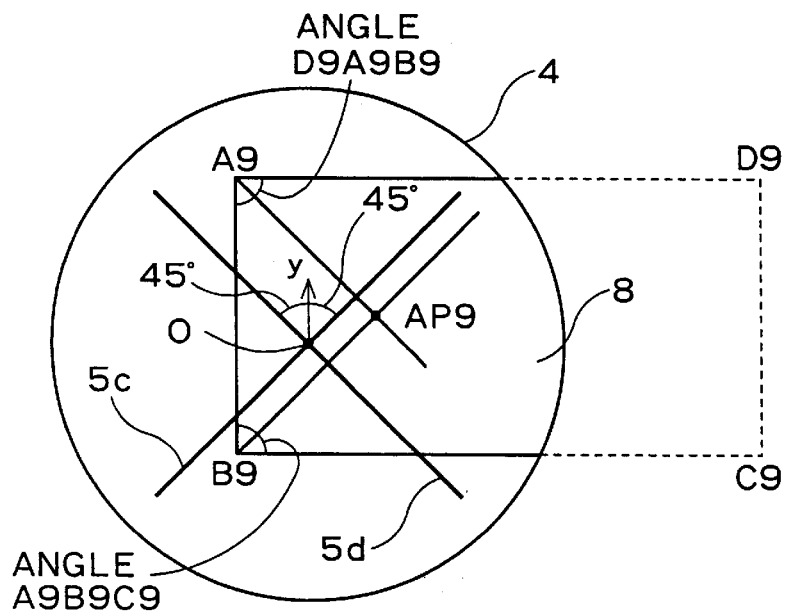
FIG. 21 shows the lens view field 4.

FIG. 21 shows the lens view field 4. Displayed at the field is a crisscross target scope having two axes 5c and 5d that tilt 45 degrees from the vertical axis y.

This 45-degree tilt of the target scope allows bisectors of angles D9A9B9 and A9B9C9 to be arranged in parallel with the axes 5d and 5c of the target scope, respectively.

In the alignment method of the eighth preferred embodiment, since the rectangular pattern 7 is used as the alignment mark, the bisectors of the angles vertically intersect with each other. This allows the use of the conventional crisscross target scope that tilts 45 degrees from the vertical axis y. Further, using the rectangular pattern is more advantageous than using the rhombic pattern, because the chip 2 generally includes a large number of rectangular patterns.

9. Ninth Preferred Embodiment

Figure 22:
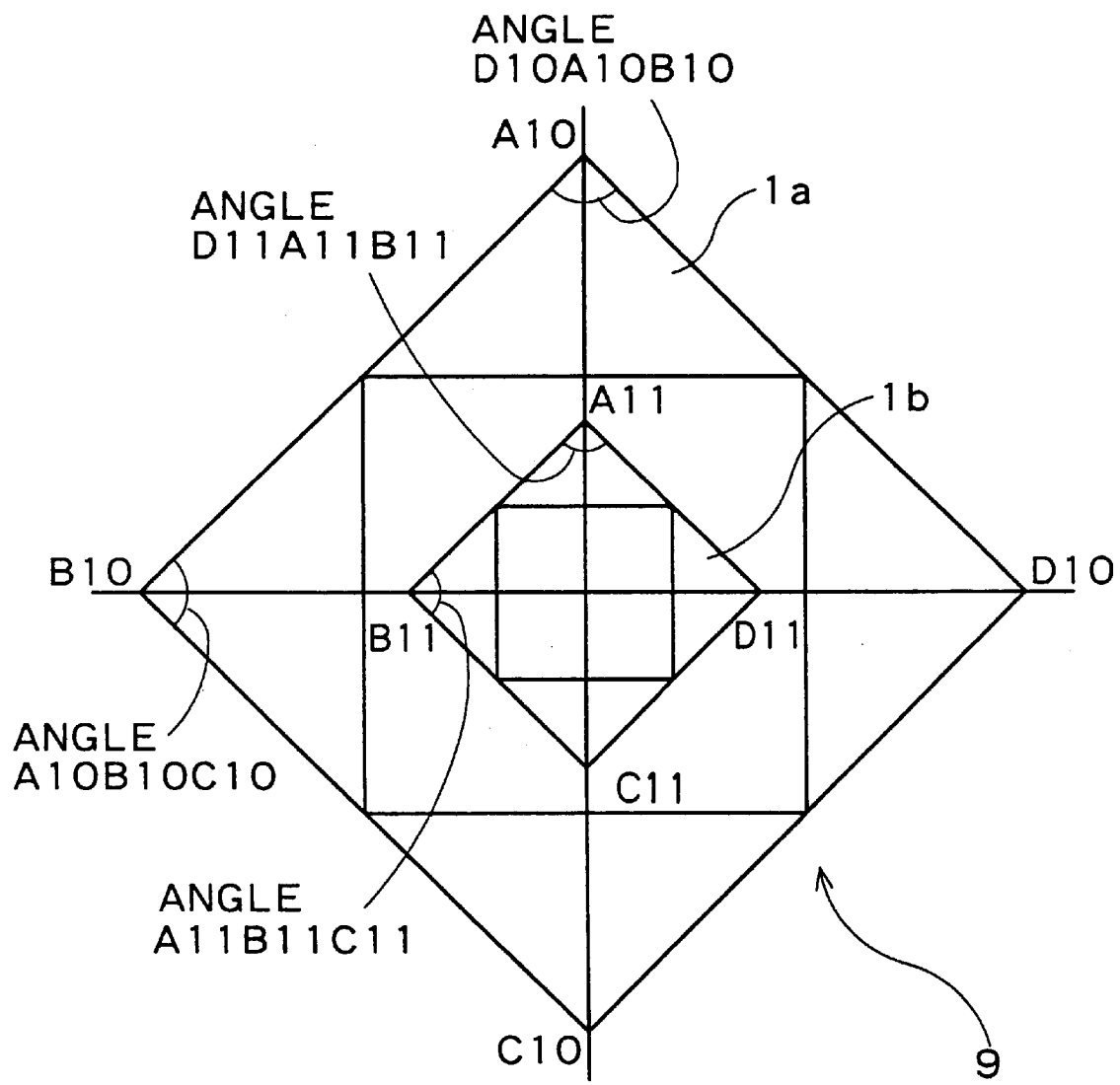
FIG. 22 is a plan view showing a structure of an alignment mark 9 used in an alignment method according to a ninth preferred embodiment of the present invention.

FIG. 22 is a plan view showing a structure of an alignment mark 9 to be used in the alignment method according to a ninth preferred embodiment of the present invention. The alignment mark 9 consists of a coarse alignment mark 1a with four vertices A10, B10, C10, and D10, and a fine alignment mark 1b with four vertices A11, B11, C11, and D11. As shown in FIG. 22, the fine alignment mark 1b is formed in the coarse alignment mark 1a. Angles D10A10B10 and A10 B10 C10 of the coarse alignment mark 1a, and angles D11A11B11 and A11B11C11 of the fine alignment mark 1b are specified to obtain bisectors. In the same way as the first preferred embodiment, an operator separately sets respective intersections of the angles of the coarse alignment mark 1a and the fine alignment mark 1b as the alignment points, and teach these points to the defect inspection apparatus. The coarse alignment mark 1a and the fine alignment mark 1b may be similar in shape as shown in FIG. 22, or may not be. Further, the alignment points of the coarse alignment mark 1a and the fine alignment mark 1b may be superimposed on each other as shown in FIG. 22, or may not be.

Figure 23:
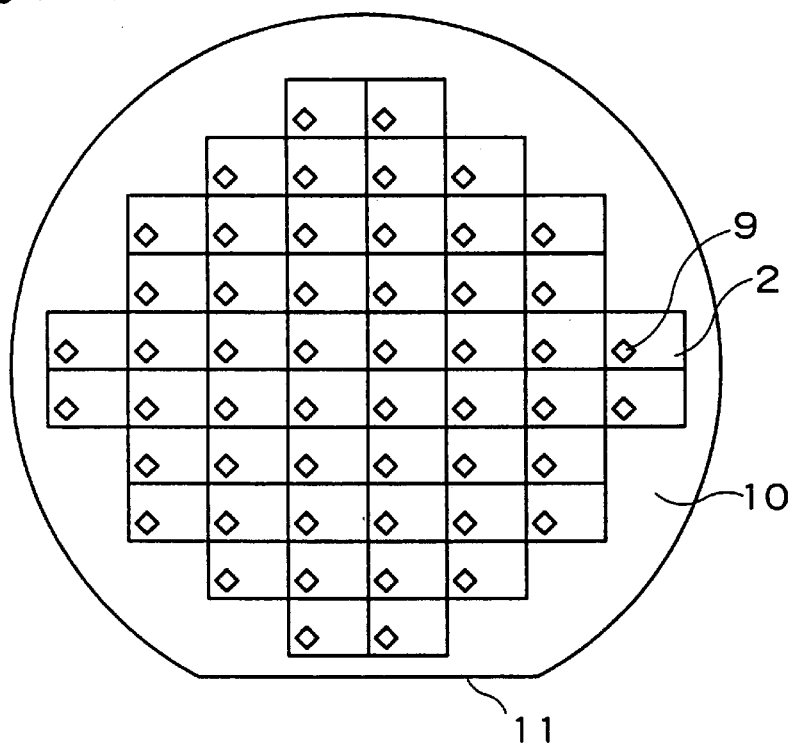
FIG. 23 is a plan view showing an overall structure of a wafer.

FIG. 23 is a plan view showing the overall structure of the wafer. The alignment mark 9 is formed on each of the plurality of chips 2 formed on a wafer 10. In the wafer 10 further provided is an orientation flat 11. In defect inspection, the wafer 10 is located on the stage of the defect inspection apparatus, and roughly aligned with reference to the outside shape of the wafer 10, including the position or direction of the orientation flat 11.

Figure 24:
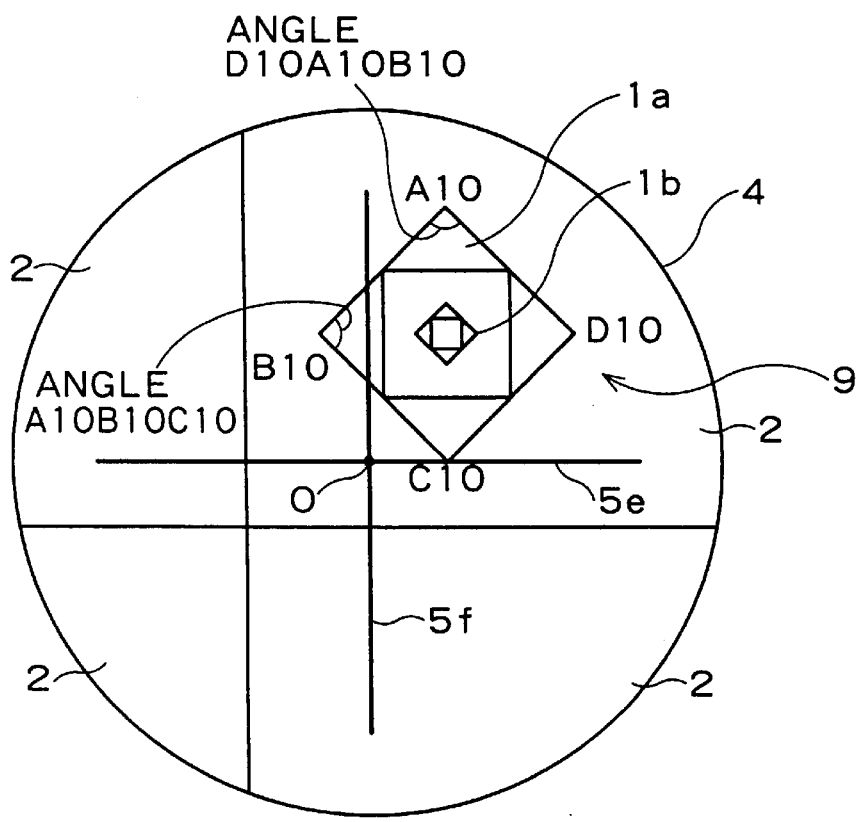
FIG. 24 shows the lens view field 4 with a low-powered lens set at a defect inspection apparatus.
Figure 25:
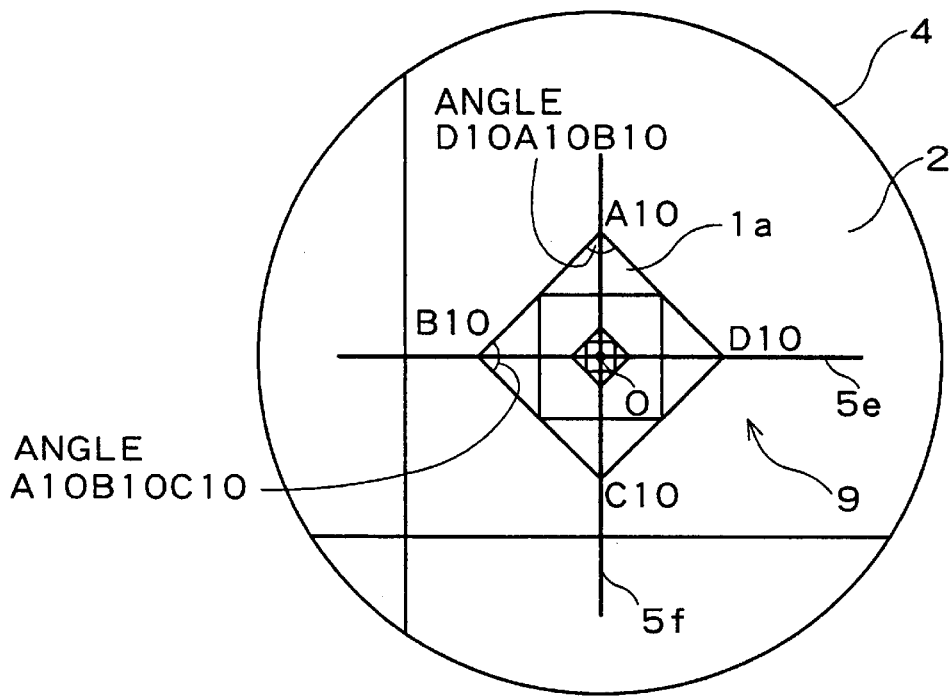
FIG. 25 shows the lens view field 4 after the chip 2 is moved.

When the defect inspection apparatus fails the automatic search for the alignment mark 9, an operator manually align the testing object by the following method. First, with a low-powered lens set at the defect inspection apparatus, the testing chip 2 is observed. FIG. 24 shows the lens view field 4 at this time. While four chips are displayed at the lens view field 4 as shown in FIG. 24, the chip 2 at the upper right is used in this case as the testing object. At the first stage, the chip 2 is aligned with reference to the alignment point of the coarse alignment mark 1a. More specifically, on the basis of the shift amount between the alignment point of the coarse alignment mark 1a and an intersection O of axes 5e and 5f of the target scope displayed at the lens view field 4, the stage drive required to superimpose the alignment point on the intersection O is calculated. Then, the stage of the defect inspection apparatus is driven to move the chip 2. FIG. 25 shows the lens view field 4 after the chip 2 is moved.

Figure 26:
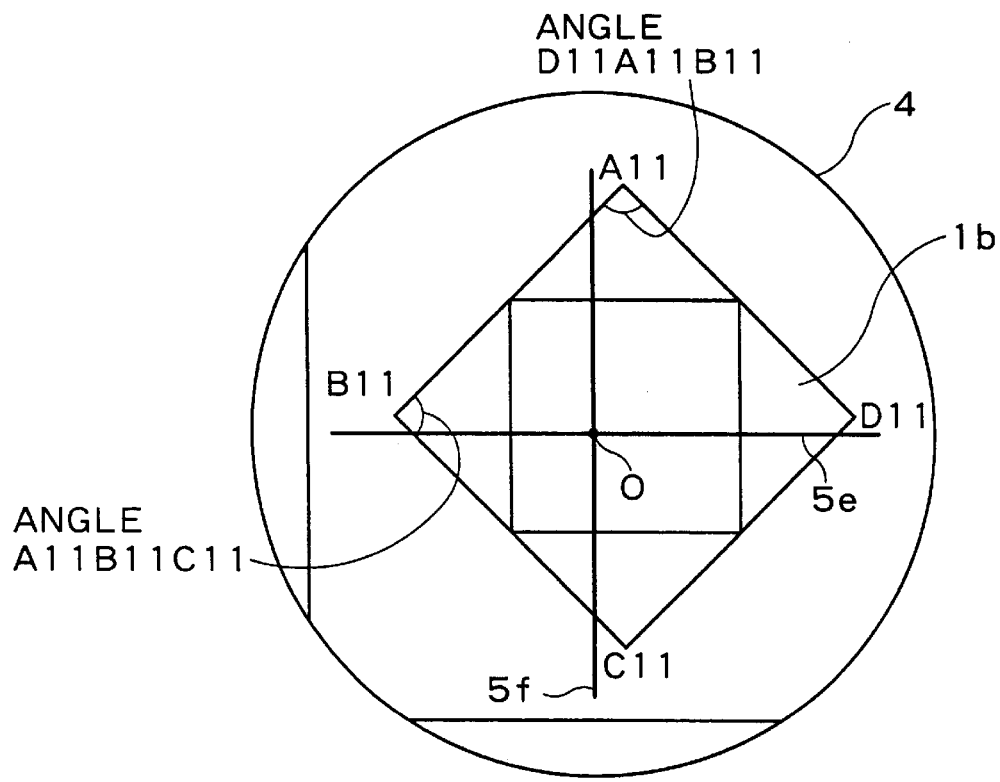
FIG. 26 shows the lens view field 4 with a high-powered lens set at the defect inspection apparatus.
Figure 27:
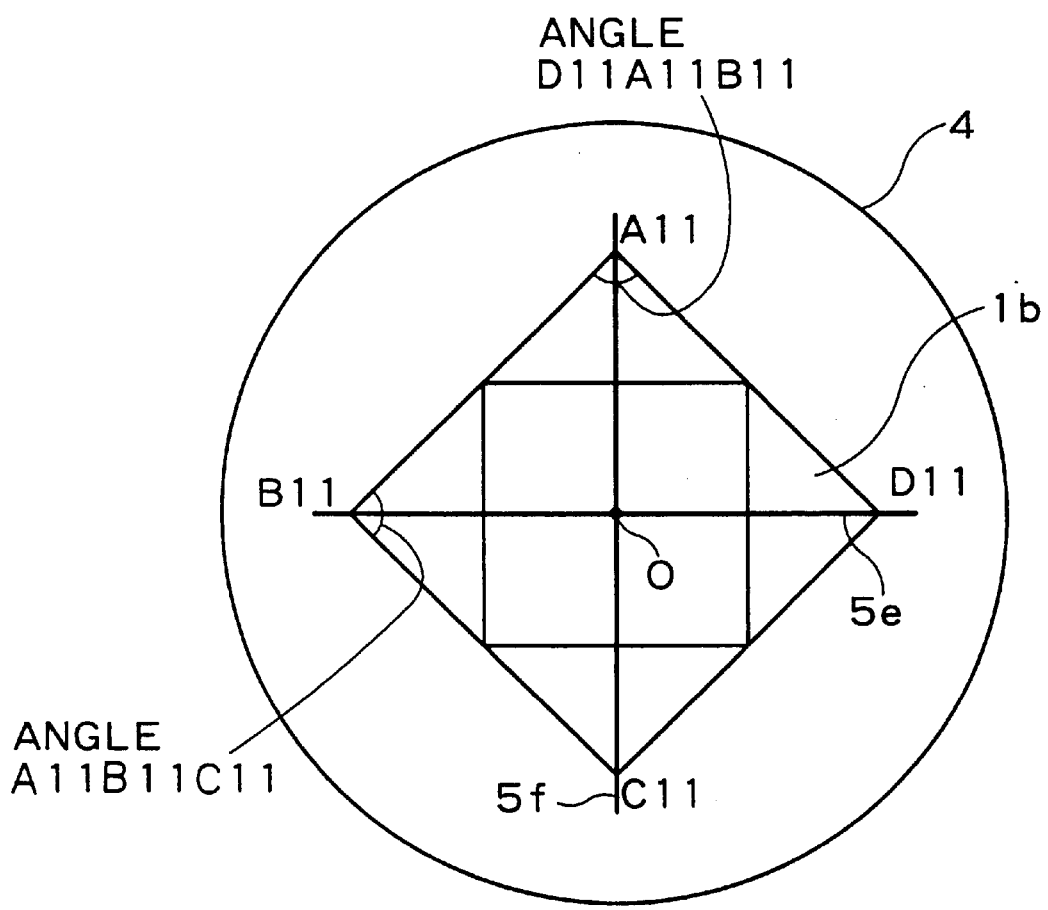
FIG. 27 shows the lens view field 4 after the chip 2 is moved.
Figure 28:
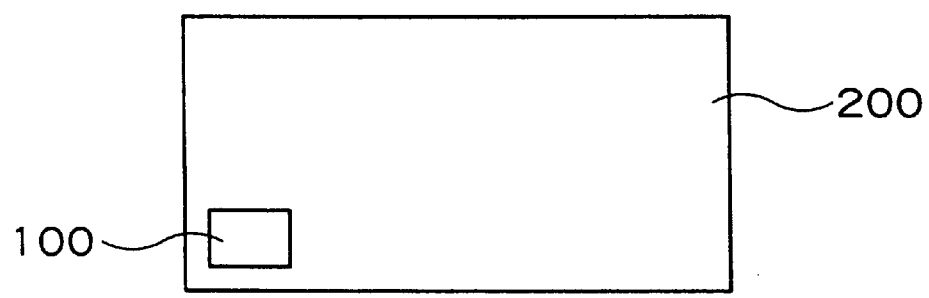
FIG. 28 is a plan view showing a structure of a chip 200.
Figure 29:
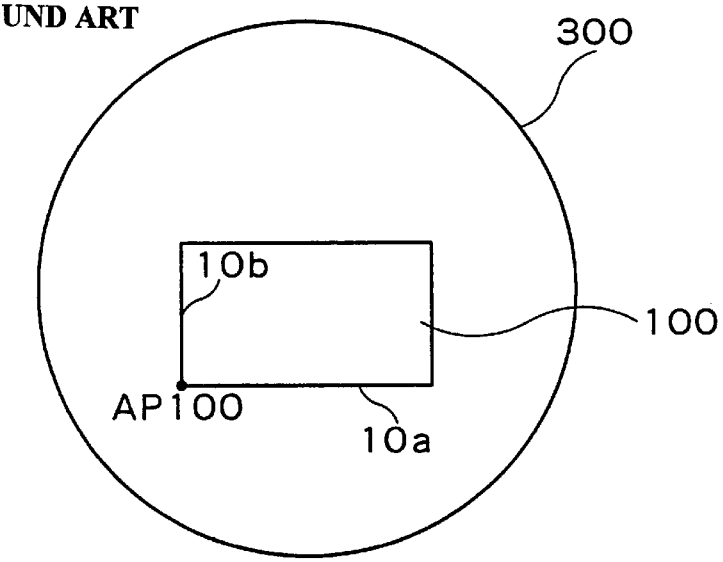
FIG. 29 shows an alignment mark 100 displayed on a teaching screen 300.
Figure 30:
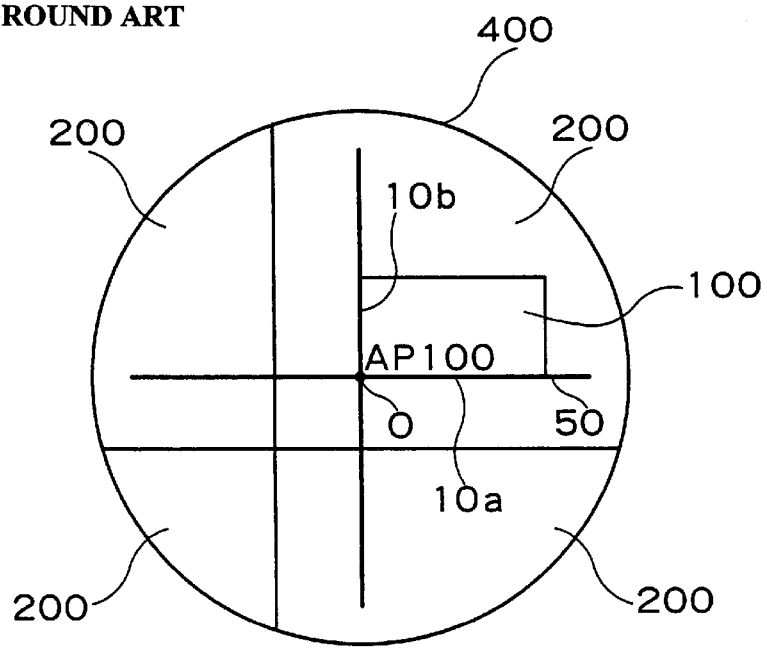
FIG. 30 is an illustration of manual alignment of the chip.
Figure 31:
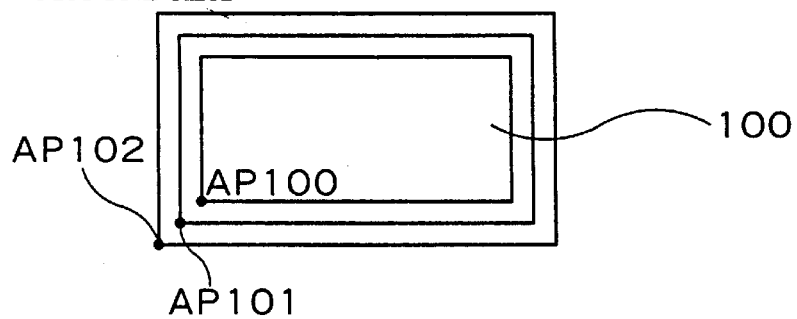
FIG. 31 shows that the outline of the alignment mark 100 is indistinct.
Figure 32:
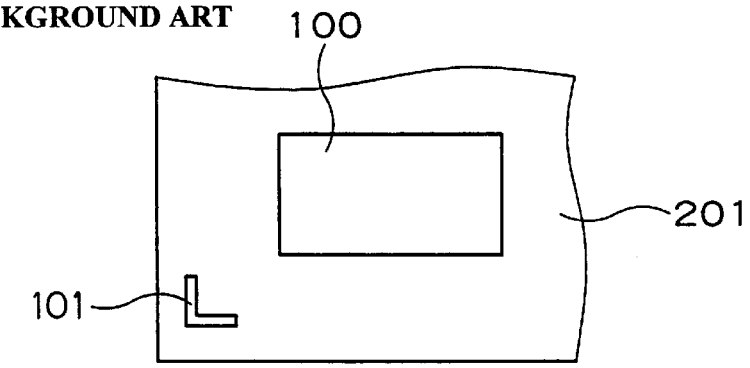
FIGS. 32 to 35 sequentially illustrate an alignment method improving accuracy in alignment.
Figure 33:
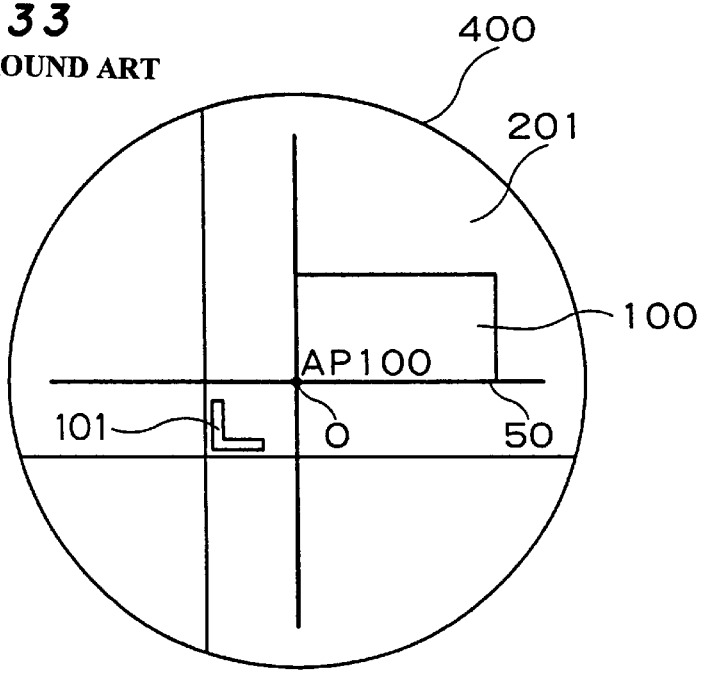
Figure 34:
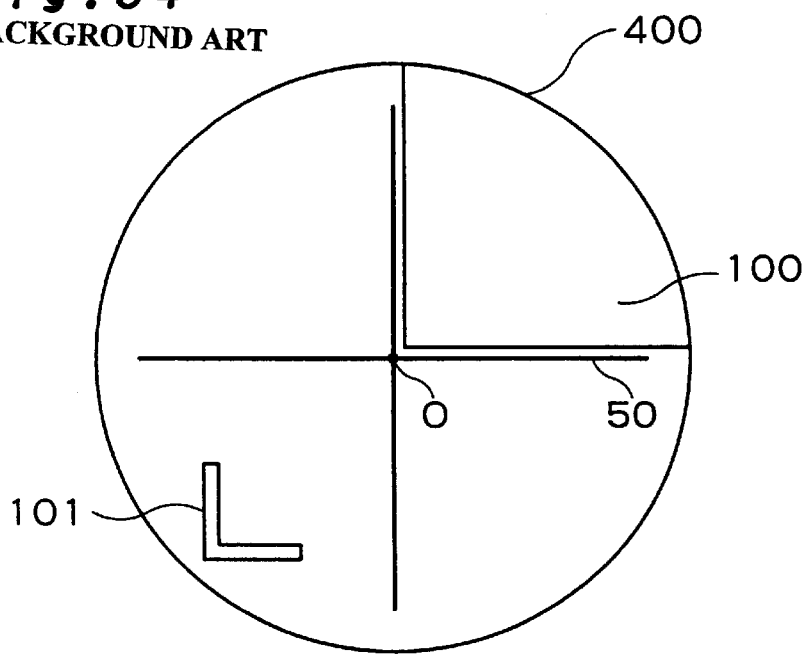
Figure 35:
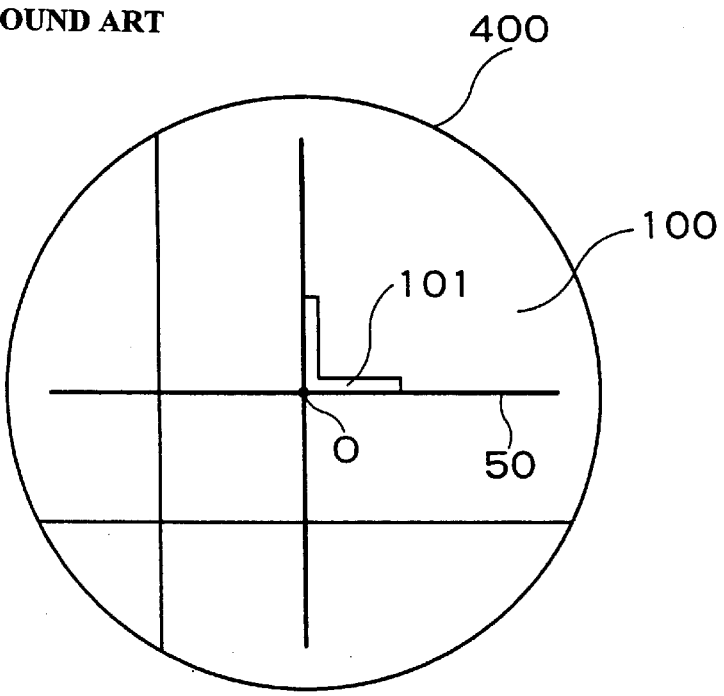

Next, a high-powered lens to observe the neighborhood of the alignment mark 9 of the chip 2 replaces the low-powered lens in the defect inspection apparatus. FIG. 26 shows the lens view field 4 at that time. Since the alignment mark 9 is observed with the high-powered lens, the enlarged fine alignment mark 1b is displayed at the lens view field 4. Then, at the second stage, the chip 2 is aligned with reference to the alignment point of the fine alignment mark 1b. More specifically, on the basis of the shift amount between the alignment point of the fine alignment mark 1b and the intersection O of the target scope, the stage drive required to superimpose the alignment point on the intersection O is calculated. Then, the stage of the defect inspection apparatus is driven to move the chip 2. FIG. 27 shows the lens view field 4 after the chip 2 is moved.

In the alignment method according to the ninth preferred embodiment, the fine alignment mark is formed in the coarse alignment mark. This reduces an area necessary to form the alignment mark, in comparison with the conventional case where the coarse alignment mark and the fine alignment mark are individually formed in the chip.

While the invention has been described in detail, the foregoing description is in all aspects illustrative and not restrictive. It is understood that numerous other modifications and variations can be devised without departing from the scope of the invention.

We claim:

1. An alignment method comprising steps of:
   locating on a testing object an alignment mark;
   determining first and second angles specified on
   a predetermined outline of said alignment mark; and
   determining an alignment point as an intersection of a first bisector of said first determined angle and a second bisector of said second determined angle.

2. The alignment method according to claim 1, wherein each of said first and second angles is formed by specifying two line segments out of a plurality of line segments and crossing said line segments,
   said plurality of line segments forming said outline.

3. The alignment method according to claim 1, wherein a search for said alignment mark is conducted within a lens view field where a target scope having first and second axes is displayed,
   said first and second axes arranged in parallel with said first and second bisectors, respectively.

4. The alignment method according to claim 3, wherein said figure is a rhombus in shape, and adjacent two angles out of four angles of said rhombus are specified as said first and second angles.

5. The alignment method according to claim 4, wherein obtaining an intersection of said first and second bisectors is equivalent to obtaining an intersection of two diagonals of said rhombus.

6. The alignment method according to claim 3, wherein said alignment mark is a pattern formed on said testing object.

7. The alignment method according to claim 6, wherein a bonding pad is used as said pattern.

8. The alignment method according to claim 6, wherein said pattern is a rectangle in shape, and two adjacent angles out of four angles of said rectangle are specified as said first and second angles.

9. The alignment method according to claim 1, wherein said alignment mark includes a coarse alignment mark and a fine alignment mark, said alignment method comprising steps of:

aligning said testing object on the basis of said coarse alignment mark, using a low-powered lens; and aligning said testing object on the basis of said fine alignment mark after changing said low-powered lens into a high-powered lens, said fine alignment mark being formed in said coarse alignment mark.

10. The alignment method according to claim 1, wherein said alignment mark consists of a plurality of figures.

11. The alignment method according to claim 1, wherein said alignment mark is formed in a dicing line.

12. The alignment method according to claim 1, wherein an angle formed by the intersection of said first and second bisectors ranges from 60 to 120 degrees.

* * * * *